United States Patent
Park et al.

(10) Patent No.: US 12,444,669 B2
(45) Date of Patent: Oct. 14, 2025

(54) SEMICONDUCTOR DEVICES WITH FLOATING PAD AND THEIR METHODS OF MANUFACTURING

(71) Applicant: Amkor Technology Singapore Holding Pte. Ltd., Singapore (SG)

(72) Inventors: Dae Young Park, Jeollanam-do (KR); Gi Jeong Kim, Gyeonggi-do (KR); Hyeong Il Jeon, Gyeonggi-do (KR); Kwang Soo Sang, Incheon (KR)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 491 days.

(21) Appl. No.: 18/084,143

(22) Filed: Dec. 19, 2022

(65) Prior Publication Data

US 2024/0203847 A1   Jun. 20, 2024

(51) Int. Cl.
*H01L 23/498* (2006.01)
*H01L 21/48* (2006.01)
*H01L 21/56* (2006.01)
*H01L 23/31* (2006.01)

(52) U.S. Cl.
CPC .......... *H01L 23/498* (2013.01); *H01L 21/485* (2013.01); *H01L 21/56* (2013.01); *H01L 23/3178* (2013.01)

(58) Field of Classification Search
CPC ...................................... H01L 23/498
USPC ............................................. 257/678
See application file for complete search history.

(56) References Cited

U.S. PATENT DOCUMENTS

2004/0075127 A1* 4/2004 Yamasaki ............ H01G 4/33
                                                            257/E27.113
2006/0033448 A1* 2/2006 Hur .................... H01J 11/30
                                                            313/364

* cited by examiner

*Primary Examiner* — Ajay Arora
(74) *Attorney, Agent, or Firm* — Spectrum IP Law Group LLC

(57) ABSTRACT

In one example, an electronic device comprises a substrate comprising a first side and a second side opposite the first side, wherein the substrate comprises a first groove at the second side of the substrate, a first electronic component over the first side of the substrate, and a resin in the first groove. The substrate comprises a floating pad at the first side of the substrate, a second groove at the first side of the substrate, and a third groove at the first side of the substrate, wherein the floating pad is between the second groove and the third groove. Other examples and related methods are also disclosed herein.

20 Claims, 9 Drawing Sheets

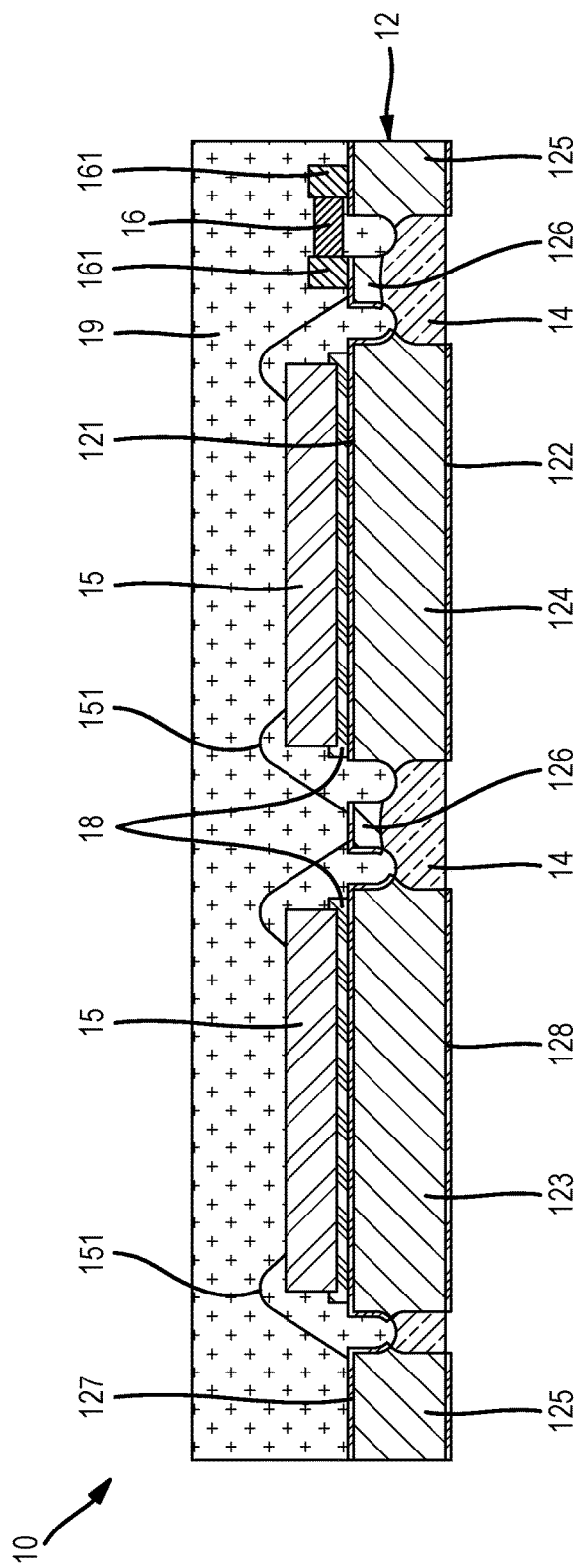
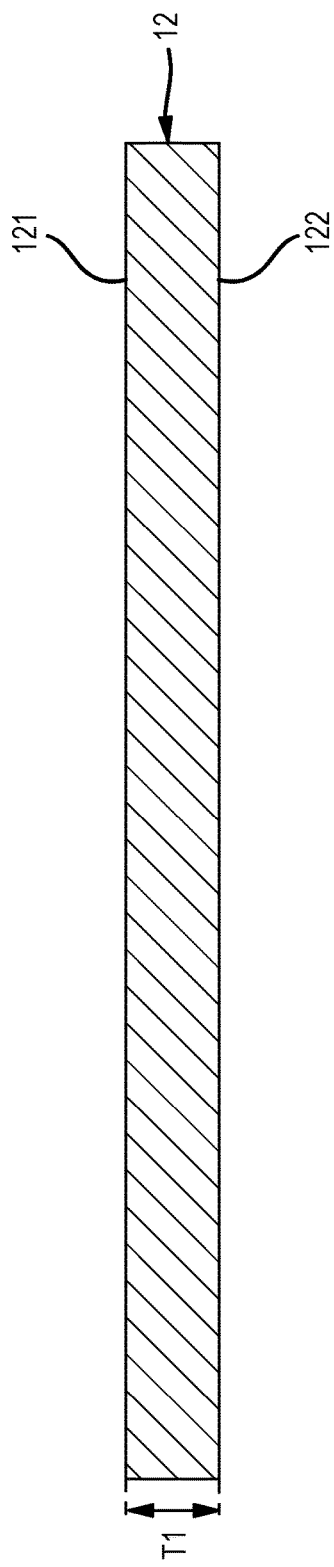
FIG.1
FIG.2A

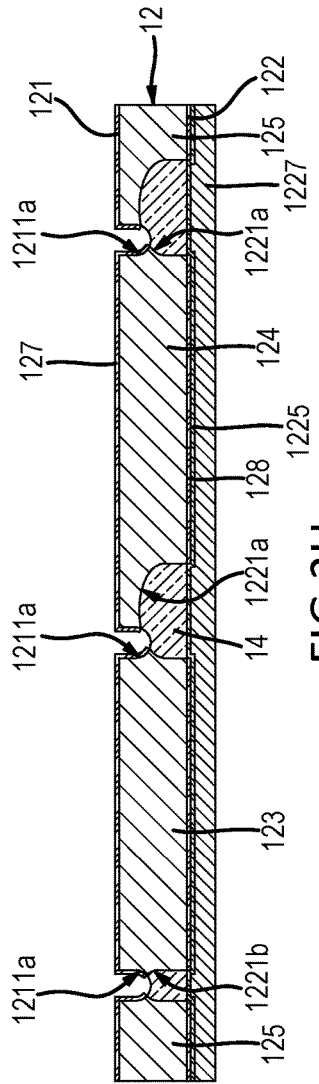
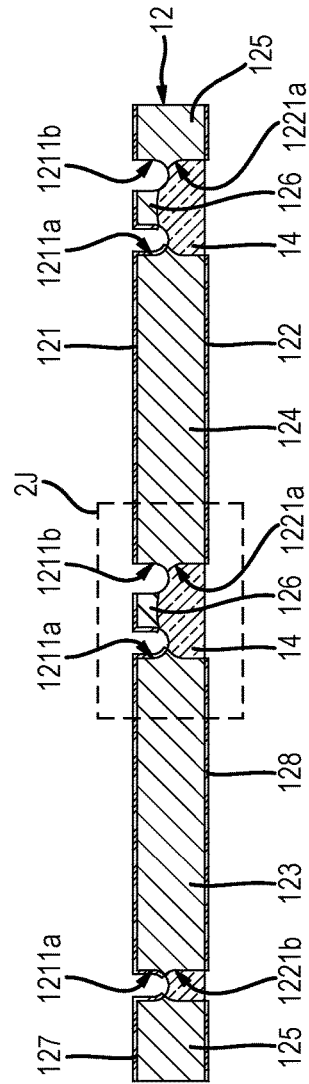
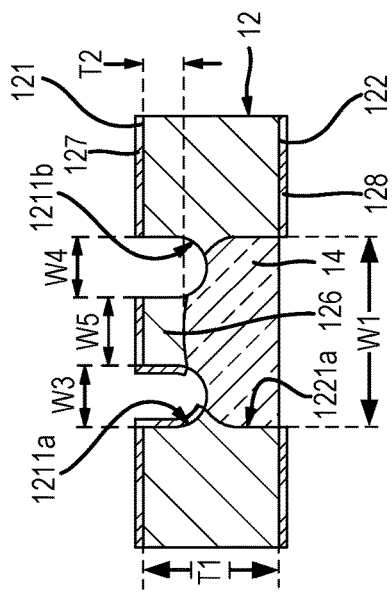
FIG.2H
FIG.2I
FIG.2J

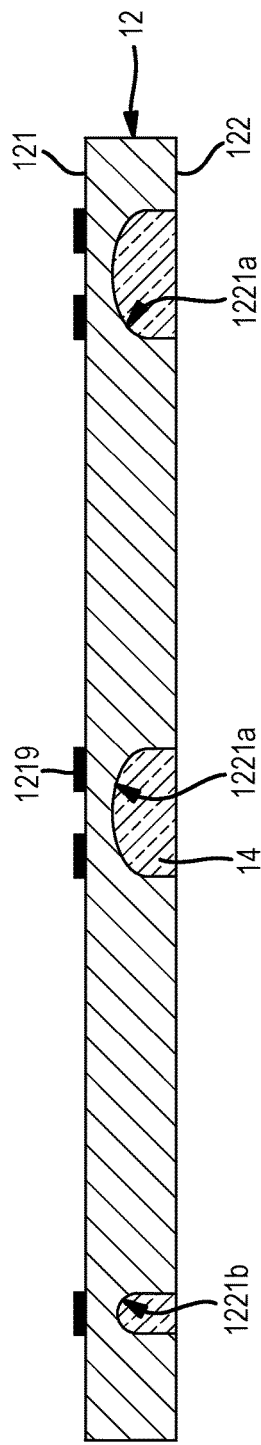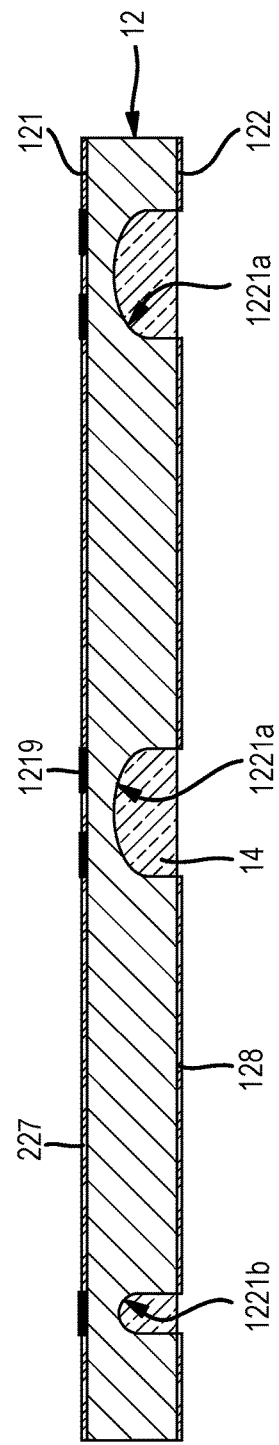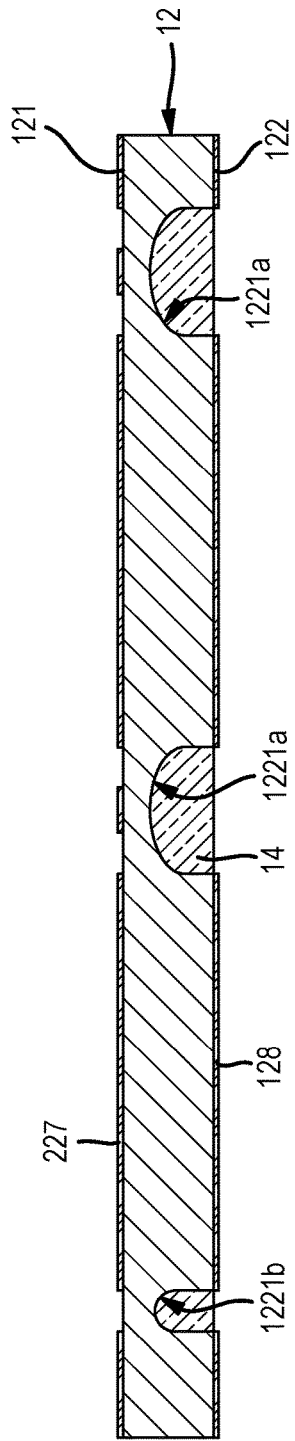

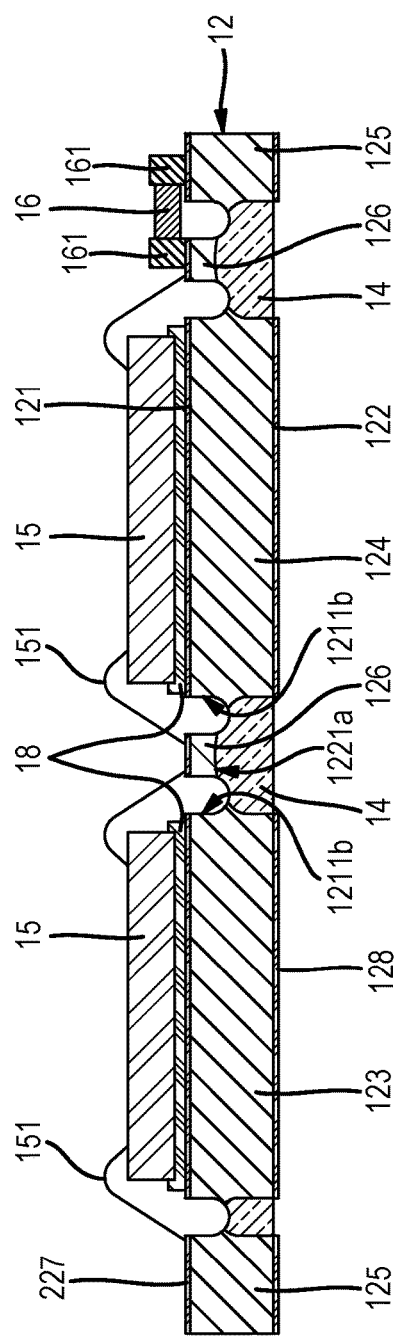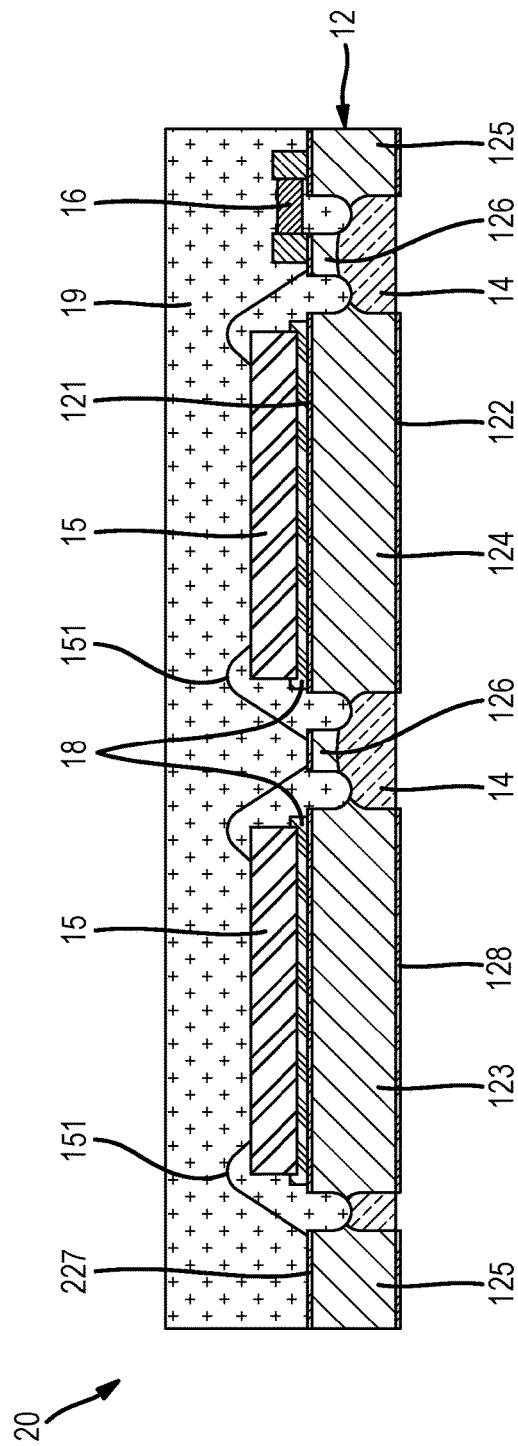

SEMICONDUCTOR DEVICES WITH FLOATING PAD AND THEIR METHODS OF MANUFACTURING

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIG. 1 shows a cross-sectional view of an example electronic device.

FIGS. 2A to 2L show cross-sectional views of an example method for manufacturing an example electronic device.

FIGS. 4A to 4G show cross-sectional views of an example method for manufacturing an example electronic device.

Figure 2B:
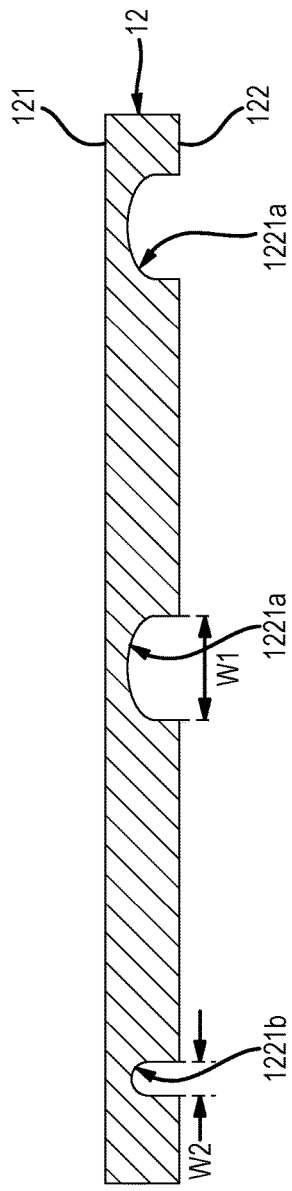

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including" are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly connected by one or more other elements. For example, if element A is coupled to element B, then element A can be directly contacting element B or indirectly connected to element B by an intervening element C. As used herein, the term "coupled" can refer to an electric coupling or a mechanical coupling. Similarly, the terms "over" or "on" may be used to describe two elements directly contacting each other or describe two elements indirectly connected by one or more other elements.

DESCRIPTION

In one example, an electronic device comprises a substrate comprising a first side and a second side opposite the first side, wherein the substrate comprises a first groove at the second side of the substrate, a first electronic component over the first side of the substrate, and a resin in the first groove. The substrate comprises a floating pad at the first side of the substrate, a second groove at the first side of the substrate, and a third groove at the first side of the substrate, wherein the floating pad is between the second groove and the third groove.

In another example, a method to manufacture an electronic device comprises providing a substrate comprising a first side and a second side opposite the first side, providing a first groove in the substrate at the second side of the substrate, providing a resin in the first groove, providing a second groove in the substrate at the first side of the substrate, providing an upper layer on the first side of the substrate, wherein the upper layer is in the second groove, and providing a third groove in the substrate at the first side of the substrate adjacent to the second groove. A floating pad is defined between the second groove and the third groove, wherein the floating pad contacts the resin, and wherein the upper layer is on a top side of the floating pad.

In a further example, a method to manufacture an electronic device comprises providing a substrate comprising a first side and a second side opposite the first side, wherein the substrate comprises a first groove in the substrate at the second side of the substrate and a resin in the first groove, providing a photoresist at first location and at a second location on the first side of the substrate, providing an upper layer on the first side of the substrate, wherein the first location and the second location are devoid of the upper layer, removing the photoresist from the first side of the substrate, and providing a second groove in the substrate on the first side of the substrate at the first location and providing a third groove in the substrate at the first side of the substrate at the second location. A floating pad is defined between the second groove and the third groove, wherein the floating pad contacts the resin, and wherein the upper layer is on a top side of the floating pad.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise substrate 12, resin 14, electronic components 15, electronic component 16, adhesive 18, and encapsulant 19.

Substrate 12 can comprise paddle 123, paddle 124, leads 125, floating pads 126, upper layer 127, and lower layer 128. Electronic components 15 can comprise component interconnects 151. Electronic component 16 can comprise component interconnects 161. In some examples, electronic components 15 can be coupled with each other via floating pad 126 and via component interconnects 151. In some examples, electronic component 15 can be coupled with electronic component 16 via floating pad 126 and via component interconnects 151 and 161.

Substrate 12, resin 14, adhesive 18, and encapsulant 19 can comprise or be referred to as an electronic package or a package. The electronic package can protect electronic components 15 and 16 from exposure to external factors or environments. The electronic package can provide a coupling between electronic components 15, between electronic components 15 and 16, and between electronic components 15 and 16 and external components or other electronic devices.

FIGS. 2A to 2L show cross-sectional views of an example method for manufacturing example electronic device 10. FIG. 2A is a cross-sectional view of electronic device 10 at an early stage of manufacture.

In the example shown in FIG. 2A, substrate 12 can be provided. In some examples, substrate 12 can comprise or be referred to as a leadframe, a routable leadframe, a molded substrate, a molded leadframe, or a routable molded leadframe (rtMLF). Substrate 12 can comprise top or first side 121 and bottom or second side 122. Bottom side 122 is opposite and oriented away from top side 121. In some examples, substrate 12 can comprise a metal such as copper, a copper alloy, nickel, a nickel alloy, iron, or an iron-nickel alloy. In some examples, the thickness T1 of substrate 12 can range from about 125 micrometers (μm) to about 250 μm. The thickness of substrate 12 refers to the distance between top side 121 and bottom side 122 of substrate 12.

FIG. 2B shows a cross-sectional view of electronic device 10 at a later stage of manufacture. In the example shown in FIG. 2B, grooves 1221a and 1221b can be provided in bottom side 122 of substrate 12. Grooves 1221a and 1221b extend partially through substrate 12 such that a portion of substrate 12 remains between top side 121 of substrate 12 and the floor of grooves 1221a and 1221b. In some examples, grooves 1221a and 1221b can be provided by etching bottom side 122 of substrate 12. For example, grooves 1221a and 1221b can be provided by drying etching, for example plasma etching, reactive ion etching (RIE), or sputter-etching, or wet etching, for example immersion or spraying. In some examples, grooves 1221a and 1221b can provide the interface between paddle 123, paddle 124, and lead 125, the interface between paddle 123 and paddle 124, or the interface between leads 125. The width W1 of groove 1221a can be greater than the width W2 of groove 1221b. Widths W1 and W2 can be measured in direction parallel to bottom side 122 of substrate 12 and at the widest point of grooves 1221a and 1221b, respectively. As described in further detail below, floating pad 126 as shown in FIG. 1 can be provided over grooves 1221a. In some examples, the depths of grooves 1221a and 1221b can range from about 50% to about 70% of the thickness T1 of substrate 12, the widths of grooves 1221a can range from about 130 μm to about 200 μm, and the widths of grooves 1221b can range from about 50 μm to about 100 μm.

Figure 2C:
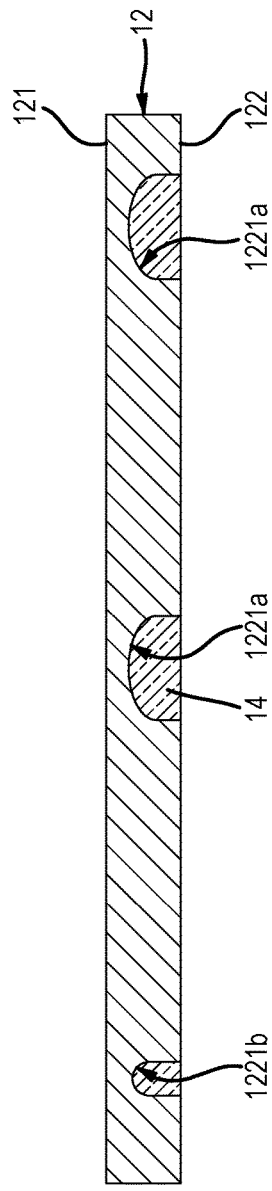

FIG. 2C shows a cross-sectional view of electronic device 10 at a later stage of manufacture. In the example shown in FIG. 2C, resin 14 can be provided in grooves 1221a and 1221b. In some examples, resin 14 can comprise or be referred to as a mold material, a protective material, or an epoxy molding compound. In some examples, resin 14 can comprise a polymer composite material, an epoxy resin, an epoxy resin with a filler, an epoxy acrylate with a filler, or a silicone resin. In some examples, resin 14 can be provided using a liquid resin screen printing process, a film assisted molding process, a compression molding process, or a transfer molding process. Resin 14 can fill grooves 1221a and 1221b on bottom side 122 of substrate 12. In some examples, resin 14 may initially extend over bottom side 122 of substrate 12. In such examples, resin 14 can be partially removed by a grinding or etching process to expose bottom side 122 of substrate 12. In some examples, the bottom side of resin 14 can be coplanar with bottom side 122 of substrate 12. In some examples, the thickness of resin 14 can range from about 60 μm to about 175 μm.

Figure 2D:
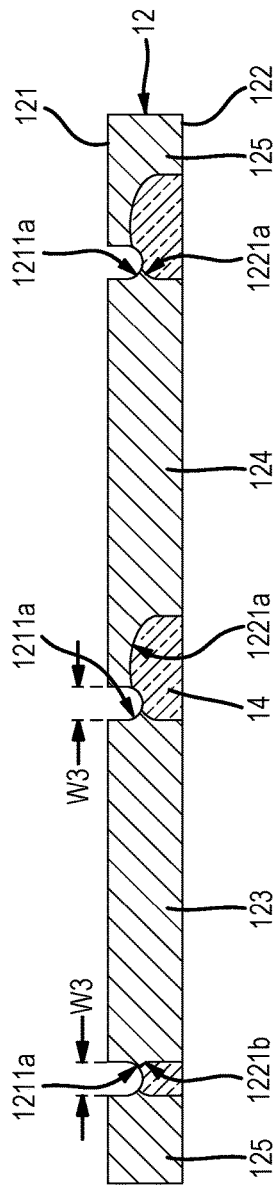

FIG. 2D shows a cross-sectional view of electronic device 10 at a later stage of manufacture. In the example shown in FIG. 2D, grooves 1211a are provide in the top side 121 of substrate 12. Grooves 1211a can provide an interface between paddle 123, paddle 124, and leads 125. In some examples, grooves 1211a can be provided by etching top side 121 of substrate 12. For example, grooves 1211a can be provided by dry etching, for example plasma etching, (RIE), or sputter-etching, or wet etching, for example immersion or spraying. Grooves 1211a can be provided over grooves 1221a and 1221b. Grooves 1211a can extend to and expose a portion of resin 14 provided in grooves 1221a and 1221b. In some examples, the width W3 of the grooves 1211a located over grooves 1221b can correspond to, or equal, the width W2 as shown in FIG. 2B of grooves 1221b. The width W3 of the grooves 1211a located over grooves 1221a is less than the width W1 of grooves 1221a. In some examples, the width W3 of the grooves 1211a located over grooves 1221b can be equal to the width W3 of the grooves 1211a located over grooves 1221a. Grooves 1211a can be formed proximate to or at one side of grooves 1221a. For example, a sidewall of groove 1211a cay be vertically aligned, or coplanar, with a sidewall of groove 1221a. Grooves 1211a can extend partially through substrate 12. For example, the depths of grooves 1211a can range from about 30% to about 50% of the thickness T1 of substrate 12, and the widths of grooves 1211a can range from about 50 μm to about 100 μm. Grooves 1211a can be connected to grooves 1221a and 1221b to provide paddle 123, paddle 124, and leads 125. In some examples, paddle 123 and paddle 124 can comprise or be referred to as die pads or pads. In some examples, groove 1221a can extend to at least one of groove 1211a or groove 1211b.

In some examples, leads 125 can comprise or be referred to as legs or lead fingers. Leads 125 can be provided at exterior sides of paddle 123 and paddle 124. In some examples, leads 125 can be provided at the edges of substrate 12. Leads 125 can be provided as electrical connections between substrate 12 and external components. Leads 125 extend from first side 121 to second side 122 of substrate 12. Stated differently, each lead 125 includes a portion of first side 121 and a portion of second side 122.

Figure 2E:
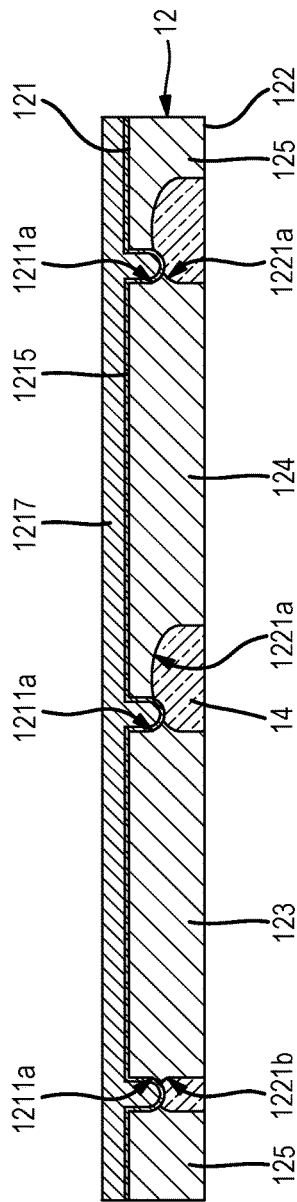

FIG. 2E shows a cross-sectional view of electronic device 10 at a later stage of manufacture. In the example shown in FIG. 2E, seed layer 1215 can be provided on top side 121 of substrate 12. In some examples, seed layer 1215 can cover top side 121 of substrate 12 entirely. Seed layer 1215 can also be provided on the inner wall of grooves 1211a. In some examples, seed layer 1215 can comprise gold, silver, copper, platinum, tin, nickel, palladium, titanium, or tungsten. In some examples, seed layer 1215 can be provided by sputtering, chemical vapor deposition (CVD), low pressure chemical vapor deposition (LPCVD), physical vapor deposition (PVD), atomic layer deposition (ALD), vacuum plating, or evaporation. As described in further detail below, seed layer 1215 can be employed to form lower layer 128 of FIG. 2F on bottom side 122 of substrate 12. In some examples, seed layer 1215 can extend continuously between (i.e., can connect) leads 125, paddle 123, and paddle 124. In some examples, the thickness of seed layer 1215 can range from about 3 µm to about 5 µm.

In accordance with various examples, insulation tape 1217 be provided on seed layer 1215. Insulation tape 1217 can cover the entire top side 121 of substrate 12. In some examples, insulation tape 1217 can comprise a polymer or polyimide. Insulation tape 1217 can prevent or reduce metal deposition on seed layer 1215.

Figure 2F:
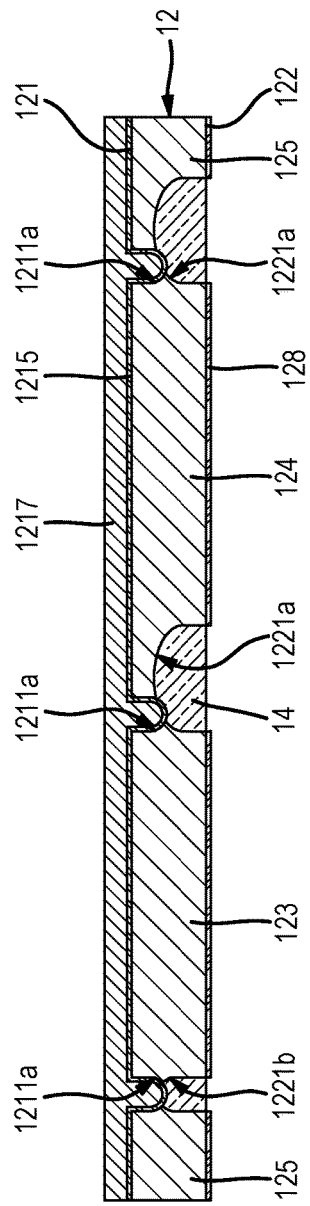

FIG. 2F shows a cross-sectional view of electronic device 10 at a later stage of manufacture. In the example shown in FIG. 2F, lower layer 128 can be provided on bottom side 122 of substrate 12. In some examples, lower layer 128 can be provided on the surfaces or bottom sides of paddle 123, paddle 124, and leads 125 exposed at the bottom side 122 of substrate 12. In some examples, lower layer 128 can comprise or be referred to as a plating, a coating, or a conductive coating. In some examples, lower layer 128 can comprise gold, silver, copper, platinum, tin, nickel, palladium, titanium, or tungsten. In some examples, lower layer 128 can be provided by electrolytic plating. Paddle 123, paddle 124, and leads 125 are electrically coupled to one another by seed layer 1215. Insulation tape 1217 is disposed on seed layer 1215 such that during electrolytic plating, lower layer 128 can be formed only on bottom side 122 of substrate 12. In some examples, the thickness of lower layer 128 can range from about 0.3 µm to about 15.2 µm.

Figure 2G:
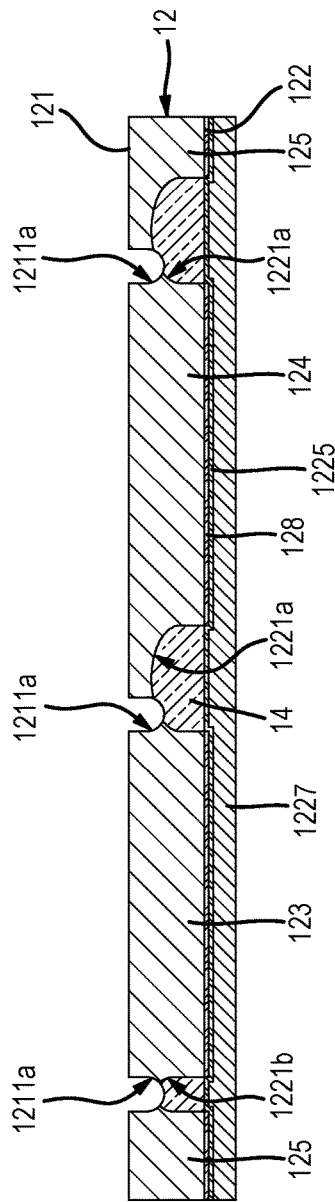

FIG. 2G shows a cross-sectional view of electronic device 10 at a later stage of manufacture. In the example shown in FIG. 2G, seed layer 1225 can be provided on bottom side 122 of substrate 12 over lower layer 128. Seed layer 1225 can be cover bottom side 122 of substrate 12 entirely. In some examples, seed layer 1225 can be provided on the surface of lower layer 128 and the surface of resin 14. In some examples, seed layer 1225 can comprise gold, silver, copper, platinum, tin, nickel, palladium, titanium, or tungsten. In some examples, seed layer 1225 can be provided by sputtering, CVD, LPCVD, PVD, ALD, vacuum plating, or evaporation. As described in further detail below, seed layer 1225 can be employed to form upper layer 127 of FIG. 2H on top side 121 of substrate 12. In some examples, seed layer 1225 can electrically couple paddle 123, paddle 124, and leads 125. In some examples, the thickness of seed layer 1225 can range from about 3 µm to about 5 µm.

In accordance with various examples, insulation tape 1227 can be provided on seed layer 1225. Insulation tape 1227 can cover the entire bottom side of substrate 12. In some examples, insulation tape 1227 can comprise a polymer or polyimide. Insulation tape 1227 can prevent or reduce metal from being deposited on seed layer 1225.

In accordance with various examples, seed layer 1215 and the insulation tape 1217 of FIG. 2F can be removed from top side 121 of substrate 12. In some examples, adhesion of insulation tape 1217 can be weakened or can be removed by heat or light, for example by laser beam. In some examples, seed layer 1215 can be removed by wet etching.

FIG. 2H shows a cross-sectional view of electronic device 10 at a later stage of manufacture. In the example shown in FIG. 2H, upper layer 127 can be provided on top side 121 of substrate 12. In some examples, upper layer 127 can be provided on surfaces or top sides of paddle 123, paddle 124, and leads 125 exposed at top side 122 of substrate 12. In some examples, upper layer 127 can also be provided on the inner sidewalls of grooves 1211a. In accordance with various examples, a portion of resin 14 can be exposed in grooves 1211a or grooves 1211b, and the portion of resin 14 exposed in grooves 1211a can be devoid of upper layer 127. In some examples, upper layer 127 can comprise or be referred to as a plating, a coating, or a conductive coating. In some examples, upper layer 127 can comprise gold, silver, copper, platinum, tin, nickel, palladium, titanium, or tungsten. In some examples, upper layer 127 can be provided by electrolytic plating. Paddle 123, paddle 124, and leads 125 are electrically coupled by seed layer 1225. Insulation tape 1227 can be formed on seed layer 1225 such that during electrolytic plating, upper layer 127 can be formed on top side 121 of substrate 12. In some examples, the thickness of upper layer 127 can range from about 0.3 µm to about 15.2 µm.

FIG. 2I shows a cross-sectional view of electronic device 10 at a later stage of manufacture. FIG. 2J shows additional details of the portion of electronic device 10 within box 2J in FIG. 2I. With combined reference to FIGS. 2I and 2J, seed layer 1225 and insulation tape 1227 can be removed from bottom side 122 of substrate 12, and grooves 1211b can be provided in top side 121 of substrate 12. In some examples, adhesion of insulation tape 1227 can be weakened or can be removed by heat or light, for example laser beams. In some examples, seed layer 1225 can be removed by wet etching. Grooves 1211b can be formed over grooves 1221a. Grooves 1211b and 1211a can thus provide floating pad 126 over resin 14 in grooves 1221a. In some examples, floating pad 126 can be between groove 1211a and groove 1211b at top side 121 of substrate 12. Substrate 12 can comprise upper layer 127 on top side 121 of substrate 12 and lower layer on bottom side 122 of substrate 12.

In some examples, grooves 1211b can be provided by etching top side 121 of substrate 12. For example, grooves 1211b can be formed by removing a portion of upper layer 127 and substrate 12 using laser etching. In some examples, upper layer 127 may not be formed on the sidewalls of grooves 1211b wherein the sidewalls of grooves 1211b can be devoid of upper layer 127. Grooves 1211b can be provided on grooves 1221a. Grooves 1211b can expose a portion of resin 14 provided in grooves 1221a. In some examples, the width W4 of groove 1211b can be equal to the width W2 of groove 1221b or the width W3 of grooves 1211a. The width W4 of groove 1211b is less than the width W1 of groove 1221a. Grooves 1211b can be formed at a side of groove 1221a that is opposite groove 1211a. For example, groove 1211a can be formed proximate a first side of groove 1221a, and groove 1211b can be formed at a second side of groove 1221a, opposite the first side. A sidewall of groove 1211b can be vertically aligned, or coplanar, with a sidewall of groove 1221a. Grooves 1211a and 1211b can be formed on groove 1221a. In some examples, the depths of grooves 1211b can range from about 30% to about 50% of the thickness of substrate 12, and the widths of grooves 1211b can range from about 50 µm to about 100 µm. Floating pad 126 can be provided on resin 14 or grooves 1221a, and floating pad 126 can be flanked by grooves 1211a and grooves 1211b. In some examples, upper layer 127 can contact a top side of floating pad 126 and a lateral side of the floating pad 126 in groove 1211a. Another lateral side of floating pad 126 in groove 1211b can be devoid of upper layer 127.

In accordance with various examples, floating pad 126 can comprise a portion of substrate 12 that is electrically separated, or electrically isolated, from paddle 123, paddle 124, and leads 125. For example, resin 14 can comprise an electrically insulating material and can electrically separate or isolate floating pads 126 from paddle 123 and paddle 124 and from leads 125. Floating pad 126 can be exposed to top side 121 of substrate 12. Floating pad 126 can be supported by resin 14. Floating pad 126 can be provided between grooves 1211a and 1211b. Floating pad 126 can be defined by the sidewalls of grooves 1211a and 1211b. In some examples, at least one sidewall, or lateral wall, of floating pad 126 can include upper layer 127 and at one sidewall of floating pad 126 can be devoid of upper layer 127. As described in further detail below, floating pad 126 can provide an electrical connection path between electronic components 15 or between electronic component 15 and electronic component 16. In some examples, the width W5 of floating pad 126 can range from about 30 µm to about 300 µm, and the height, or thickness, T2 of floating pad 126 can range from about 37 µm to about 125 µm. The width W5 of floating pad 126 can be smaller than the widths W1 of grooves 1221a. The height T2 of floating pad 126 is less than the thickness T1 of substrate 12. In some examples, the height T2 of floating pad 126 is less than the thickness T1 of leads 125 and paddle 123 and paddle 124. The height T2 of floating pad 126 can be measured between the floor of groove 1221a and top side 121 of substrate 12.

Figure 2K:
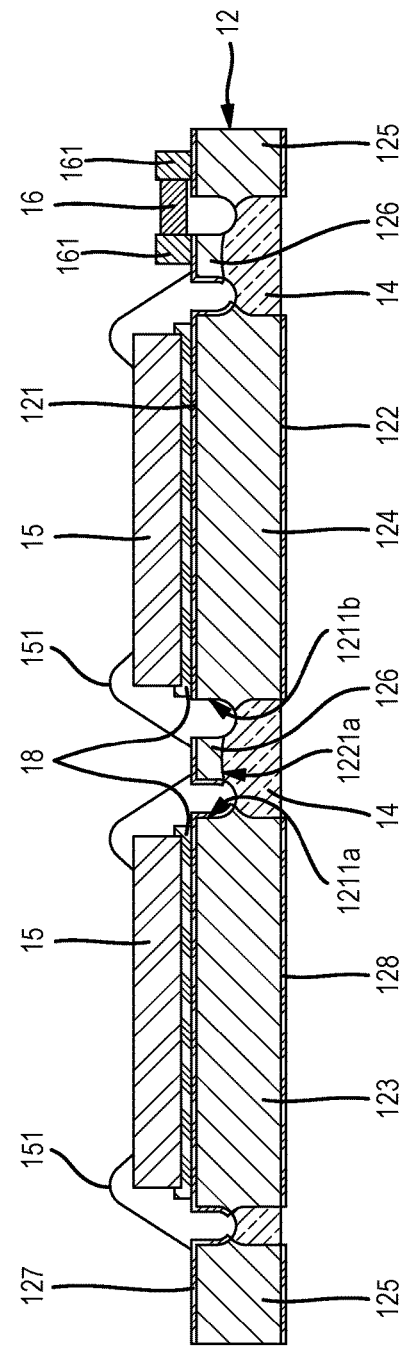

FIG. 2K shows a cross-sectional view of electronic device 10 at a later stage of manufacture. In the example shown in FIG. 2K, electronic components 15 and 16 can be provided on top side 121 of substrate 12. In some examples, electronic components 15 can be provided over top side 121 of substrate 12 on each of paddle 123 and paddle 124, and electronic component 16 can be provided between leads 125 and floating pad 126. Paddle 123 and paddle 124 can support electronic components 15. Paddle 123 and paddle 124 can be spaced apart from each other. In some examples, electronic components 15 can be seated on top sides of paddle 123 and paddle 124. In some examples, electronic components 15 can be attached or coupled to upper layer 127 of pads 123 and 124 through adhesive 18. In some examples, component interconnects 161 of electronic component 16 can be coupled to upper layer 127 on leads 125 and floating pad 126 by a mass reflow process, a thermal compression process, or a laser bonding process.

In some examples, electronic components 15 can each comprise or be referred to as one or more dies, chips, or packages. In some examples, electronic components 15 can each be an active device or a passive device such as an integrated passive device (IPD). For example, electronic component 15 can comprise an electrical circuit, such as a memory, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC). In some examples, the area or footprint of each electronic component 15 can be equal to or less than the area or footprint of its respective paddle 123 or paddle 124. In some examples, the height of electronic components 15 can range from about 150 µm to about 650 µm. In some examples, the height of electronic components 15 can range from about 150 µm to about 400 µm. In some examples, the height of electronic components 15 can range from about 152 µm to about 254 µm.

In some examples, component interconnects 151 can comprise or be referred to as wires or wirebonds. Component interconnects 151 can couple electronic components 15 to leads 125 or to floating pad 126. In some examples, electronic component 15 can be coupled to one or more leads 125 through component interconnects 151. In some examples, electronic component 15 can be coupled to one or more leads 125 through component interconnects 151, floating pad 126, and electronic component 16. In some examples, component interconnects 151 can be coupled to leads 125 or floating pad 126 by wire bonding or a solder reflow process. In some examples, component interconnects 151 can comprise copper, aluminum, palladium, titanium, tungsten, titanium/tungsten, nickel, gold, or silver.

In some examples, electronic component 16 can comprise or be referred to as one or more dies, chips, or packages. In some examples, electronic component 16 can be an active device or a passive device or integrated passive device (IPD). For example, electronic component 16 can comprise a capacitor, an inductor, or resistor. In some examples, electronic component 16 can couple floating pad 126 to one or more leads 125. In some examples, the height of electronic component 16 can range from about 300 µm to about 650 µm. In some examples, the height of electronic component 16 can range from about 450 µm to about 650 µm In some examples, the height of electronic component 16 can range from about 550 µm to about 650 µm.

In some examples, adhesive 18 can comprise or be referred to as an interface material, an adhesive film, or an adhesive tape. Adhesive 18 can be provided between paddle 123, paddle 124, and electronic components 15. In some examples, adhesive 18 can be in contact with upper layer 127 on paddle 123 and paddle 124. In some examples, adhesive 18 can comprise a heat curing adhesive, a light curing adhesive, or a non-curing adhesive, for example a rubber adhesive, an acrylic adhesive, a vinyl alkyl ether adhesive, a silicone adhesive, a polyester adhesive, a polyamide adhesive, or a urethane adhesive, and so on. In some examples, adhesive 18 can be cured to attach or fix electronic components 15 to paddle 123 and paddle 124. In some examples, the thickness of adhesive 18 can range from about 10 µm to about 50 µm.

Figure 2L:
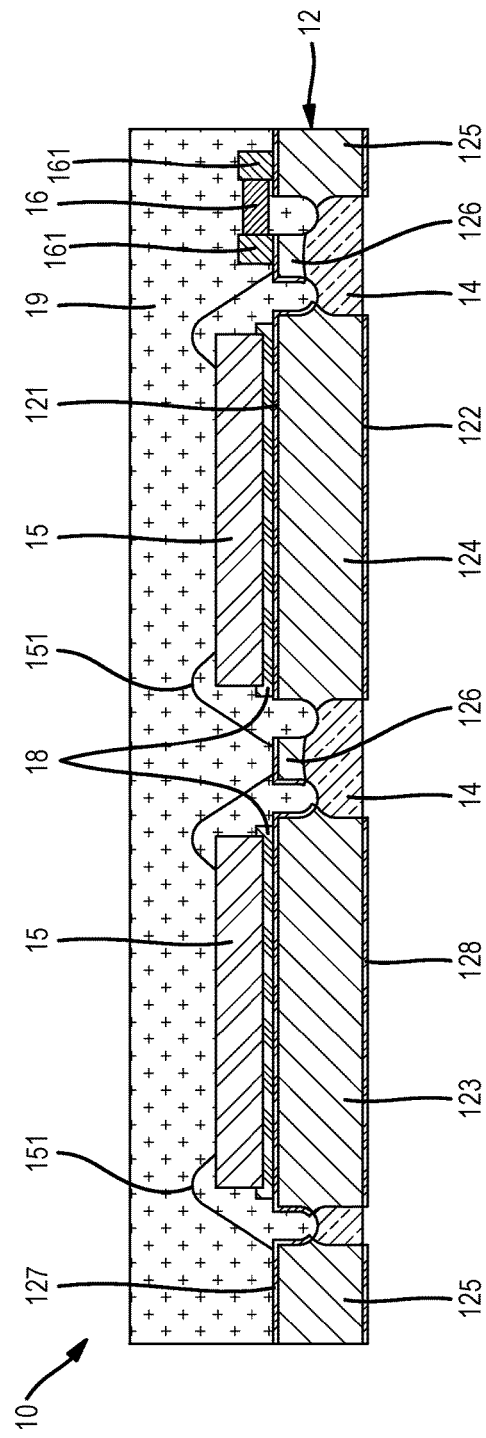

FIG. 2L shows a cross-sectional view of electronic device 10 at a later stage of manufacture. In the example shown in FIG. 2L, encapsulant 19 can be provided over substrate 12 and electronic components 15 and 16. Encapsulant 19 can be over or cover top side 121 of substrate 12 and can encapsulate electronic components 15 and 16 and component interconnects 151 and 161. In some examples, encapsulant can contact a lateral side of electronic component 15 or an lateral side of electronic component 16. Encapsulant 19 can fill grooves 1211a and 1211b. In some examples, encapsulant 19 can contact upper layer 127, resin 14, and one or more sidewalls of floating pad 126. Encapsulant 19 can expose lateral sides of leads 125. In some examples, encapsulant 19 can comprise or be referred to as epoxy, resin, polymer, a mold compound, a protective material, or a mold material. In some examples, encapsulant 19 can be provided by a compression molding process, a transfer molding process, or a film assisted molding process. In some examples, the thickness of encapsulant 19 can range from about 650 µm to about 750 µm.

Figure 3:
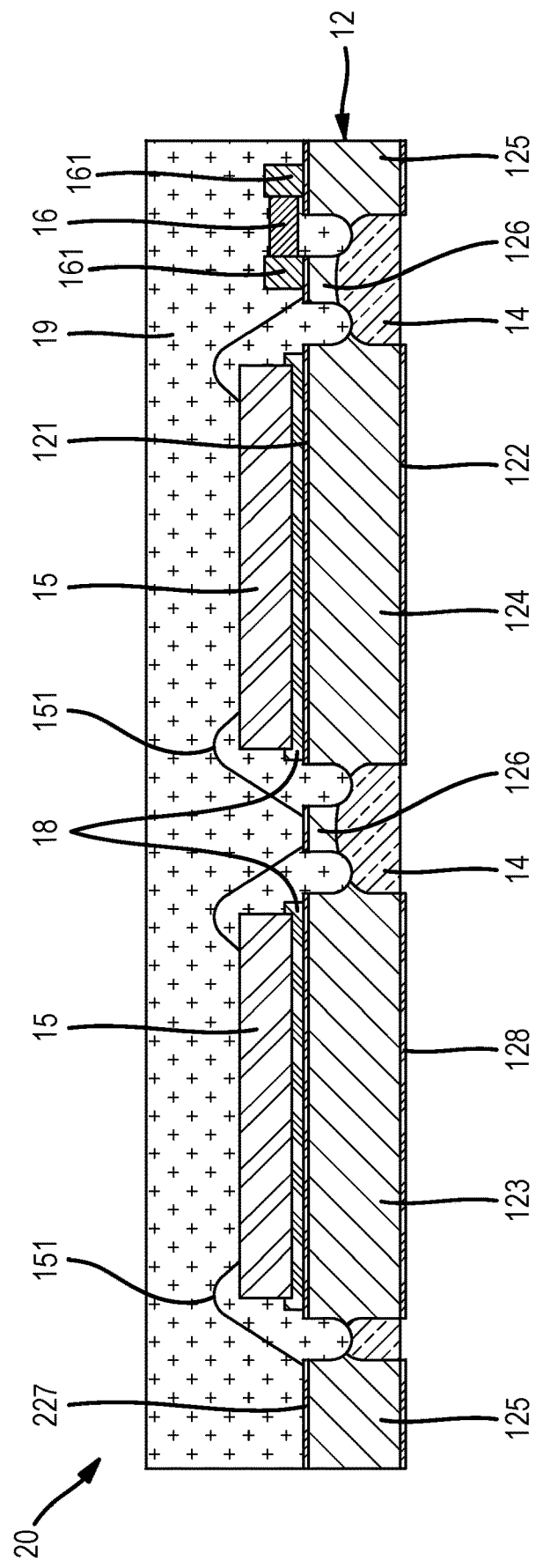
FIG. 3 shows a cross-sectional view of an example electronic device.

FIG. 3 shows a cross-sectional view an example electronic device 20. In the example shown in FIG. 3, electronic device 20 can comprise substrate 12, resin 14, electronic components 15, electronic component 16, adhesive 18, and encapsulant 19. In some examples, electronic device 20 can comprise similar elements, features, materials, or formation processes to those of electronic device 10, as previously described.

Substrate 12 can comprise paddle 123, paddle 124, leads 125, floating pads 126, upper layer 227, and lower layer 128. Electronic components 15 can comprise component interconnects 151. Electronic component 16 can comprise component interconnects 161.

FIGS. 4A to 4G show cross-sectional views of an example method for manufacturing example electronic device 20.

FIG. 4A shows a cross-sectional view of electronic device 20 at an early stage of manufacture. In the example shown in FIG. 4A, the operations described with respect to FIGS. 2A to 2C can be followed, and photoresist 1219 can be provided on top side 121 of substrate 12. In some examples, photoresist 1219 can be patterned using a photo mask. For example, photoresist 1219 can be applied to top side 121 of substrate 12, and a photomask can be positioned on portions of photoresist 1219 where grooves 1211b as shown in FIG. 4C are subsequently formed. Photoresist 1219 can then be patterned through exposure and development processes, such that photoresist 1219 remains or is provided on the portions of top side 121 where the grooves 1211b as shown in FIG. 4C are to be formed.

FIG. 4B shows a cross-sectional view of electronic device 20 at a later stage of manufacture. In the example shown in FIG. 4B, upper layer 227 can be provided on top side 121 of substrate 12, and lower layer 128 can be provided on bottom side 122 of substrate 12. In some examples, upper layer 227 and lower layer 128 can be simultaneously provided on substrate 12 by electrolytic plating. Upper layer 227 can be provided on portions of top side 121 of substrate 12 that are devoid of photoresist 1219. For example, upper layer 227 can be provided on portions of substrate 12 corresponding to paddle 123, paddle 124, leads 125, and floating pad 126 as shown in FIG. 1. In some examples, upper layer 227 can comprise similar elements, features, materials, or formation processes to those of upper layer 127 as previously described.

FIG. 4C shows a cross-sectional view of electronic device 20 at a later stage of manufacture. In the example shown in FIG. 4C, photoresist 1219 can be removed from top side 121 of substrate 12. Top side 121 of substrate 12 can be exposed from upper layer 227.

Figure 4D:
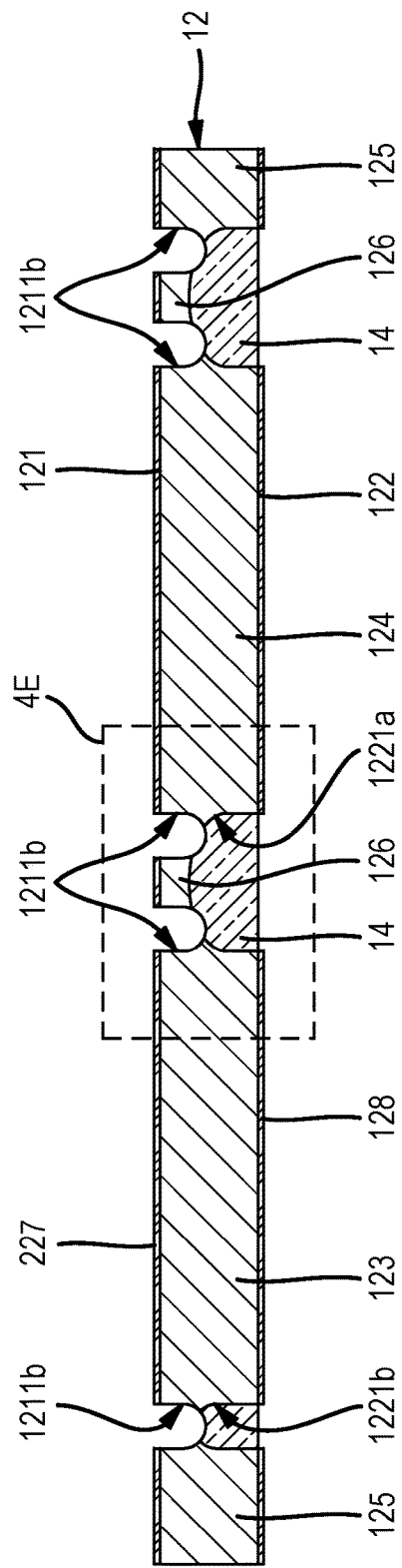
Figure 4E:
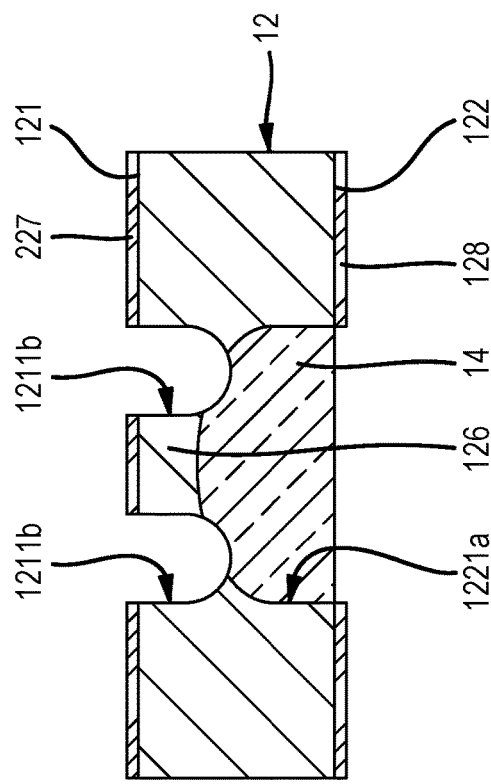

FIG. 4D shows a cross-sectional view of electronic device 20 at a later stage of manufacture. For the example shown in FIG. 4D, additional details are shown in FIG. 4E for the portion of electronic device 20 within box 4E of FIG. 4D. With combined reference to FIGS. 4D and 4E, grooves 1211b can be provided in top side 121 of substrate 12. In some examples, grooves 1211b can be provided in portions of top side 121 that are exposed from upper layer 227. Grooves 1211b can be formed over grooves 1221a and 1221b. The grooves 1211b formed over grooves 1211a can provide floating pad 126 over resin 14 in grooves 1221a. For example, a first groove 1221b can be formed proximate a first side of groove 1221a and a second groove 1221b can be formed proximate a second, opposing side of groove 1221a, thereby providing floating pad 126 over groove 1221a.

Grooves 1211b can provide an interface between paddle 123 and paddle 124, between paddle 123 and paddle 124 and leads 125, between paddle 123 and paddle 124 and floating pad 126, or between leads 125 and floating pads 126. For examples, grooves 1211b can provide or define a portion of a lateral sidewall of paddle 123, paddle 124, leads 125, and floating pads 126. In some examples, grooves 1211b can be provided by drying etching, for example plasma etching, reactive ion etching (RIE), or sputter-etching or wet etching, for example immersion or spraying. Grooves 1211b can expose resin 14 located in grooves 1221a and 1221b. In accordance with various embodiments, upper layer 227 can be located only on the top side of floating pad 126, such that the sidewalls of grooves 1211b, and the sidewalls of paddle 123, paddle 124, leads 125, and floating pads 126, are devoid of upper layer 227.

In accordance with various examples, floating pad 126 can be electrically separated, or electrically isolated, from paddle 123, paddle 124, and leads 125. For example, resin 14 can comprise an electrically insulating material and can electrically separate or isolate floating pads 126 from paddle 123 and paddle 124 and from leads 125. Floating pad 126 can be exposed to or at top side 121 of substrate 12. Floating pad 126 can be supported by resin 14. Floating pad 126 can be provided between grooves 1211b.

FIG. 4F shows a cross-sectional view of electronic device 20 at a later stage of manufacture. In the example shown in FIG. 4F, electronic components 15 and electronic component 16 can be provided on top side 121 of substrate 12. Floating pad 126 can provide an electrical connection path between electronic components 15 or between electronic component 15 and electronic component 16. In some examples, component interconnects 161 of electronic component 16 can be coupled to upper layer 227 on leads 125 and floating pad 126 by a mass reflow process, a thermal compression process, or a laser bonding process. Component interconnects 151 can couple electronic components 15 to leads 125 or to floating pad 126.

FIG. 4E shows a cross-sectional view of electronic device 20 at a later stage of manufacture. In the example shown in FIG. 4E, encapsulant 19 can be provided over substrate 12 and electronic components 15 and 16. encapsulant 19 can fill grooves 1211b. In some examples, encapsulant 19 can contact upper layer 227 and portions of resin 14 exposed in grooves 1211b. Encapsulant 19 can the sidewalls of paddle 123, paddle 124, leads 125, and floating pad 126. Encapsulant 19 can expose lateral sides of leads 125, which can be devoid of upper layer 227.

The present disclosure includes reference to certain examples. It will be understood by those skilled in the art, however, that various changes may be made, and equivalents may be substituted, without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
    a substrate comprising a first side and a second side opposite the first side, wherein the substrate comprises a first groove at the second side of the substrate;
    a first electronic component over the first side of the substrate; and
    a resin in the first groove;
    wherein the substrate comprises a floating pad at the first side of the substrate, a second groove at the first side of the substrate, and a third groove at the first side of the substrate, wherein the floating pad is between the second groove and the third groove.

2. The electronic device of claim 1, wherein:
    the substrate includes an upper layer at the first side of the substrate a lower layer on the second side of the substrate; and
    the upper layer contacts a top side of the floating pad and a first lateral side of the floating pad in the second groove.

3. The electronic device of claim 2, wherein:
    a second lateral side of the floating pad in the third groove is devoid of the upper layer.

4. The electronic device of claim 1, wherein:
the substrate includes an upper layer at the first side of the substrate;
the upper layer contacts a top side of the floating pad; and
a first lateral side of the floating pad in the second groove and a second lateral side of the floating pad in the third groove are devoid of the upper layer.

5. The electronic device of claim 1, wherein:
the substrate comprises a paddle and a lead;
the floating pad is electrically isolated from the paddle and the lead; and
a thickness of the floating pad is less than a thickness of the lead.

6. The electronic device of claim 1, wherein:
the substrate comprises a first paddle and a second paddle;
the second groove is between the floating pad and the first paddle;
the third groove is between the floating pad and the second paddle;
the first electronic component is over the first paddle, and a second electronic component is over the second paddle; and
the first electronic component is coupled with the second electronic component via the floating pad.

7. The electronic device of claim 1, wherein:
a portion of the resin is exposed in at least one of the second groove or the third groove.

8. The electronic device of claim 1, further comprising:
an encapsulant over the first side of the substrate and contacting a lateral side of the first electronic component.

9. The electronic device of claim 1, wherein:
the first groove extends to at least one of the second groove or the third groove.

10. The electronic device of claim 1, wherein:
the substrate comprises a first paddle and a first lead, the first lead being located at a lateral side of the substrate;
the second groove is between the floating pad and the first paddle;
the first paddle is between the floating pad and the first lead;
the first electronic component is over the first paddle;
a second electronic component coupled with the floating pad; and
the first electronic component is coupled with the second electronic component via the floating pad.

11. A method to manufacture an electronic device, comprising:
providing a substrate comprising a first side and a second side opposite the first side;
providing a first groove in the substrate at the second side of the substrate;
providing a resin in the first groove;
providing a second groove in the substrate at the first side of the substrate;
providing an upper layer on the first side of the substrate, wherein the upper layer is in the second groove; and
providing a third groove in the substrate at the first side of the substrate adjacent to the second groove;
wherein a floating pad is defined between the second groove and the third groove, wherein the floating pad contacts the resin, and wherein the upper layer is on a top side of the floating pad.

12. The method of claim 11, wherein:
the upper layer is on a first sidewall of the floating pad in the second groove.

13. The method of claim 12, wherein:
a second sidewall of the floating pad in the third groove is devoid of the upper layer.

14. The method of claim 11, comprising:
providing a first electronic component over the first side of the substrate;
coupling the first electronic component with the floating pad; and
providing an encapsulant over the first side of the substrate, wherein the encapsulant contacts a lateral side of the first electronic component, and wherein the encapsulant is in the second groove and the third groove.

15. The method of claim 14, comprising:
prior to providing the encapsulant:
providing a second electronic component over the first side of the substrate; and
coupling the second electronic component with the first electronic component via the floating pad.

16. A method to manufacture an electronic device, comprising:
providing a substrate comprising a first side and a second side opposite the first side, wherein the substrate comprises a first groove in the substrate at the second side of the substrate and a resin in the first groove;
providing a photoresist at first location and at a second location on the first side of the substrate;
providing an upper layer on the first side of the substrate, wherein the first location and the second location are devoid of the upper layer;
removing the photoresist from the first side of the substrate; and
providing a second groove in the substrate on the first side of the substrate at the first location and providing a third groove in the substrate at the first side of the substrate at the second location;
wherein a floating pad is defined between the second groove and the third groove, wherein the floating pad contacts the resin, and wherein the upper layer is on a top side of the floating pad.

17. The method of claim 16, wherein:
a first sidewall of the floating pad in the second groove and a second sidewall of the floating pad in the third groove are devoid of the upper layer.

18. The method of claim 16, wherein:
the second groove is between a paddle of the substrate and the floating pad; and
the third groove is between the paddle and a lead of the substrate.

19. The method of claim 16, comprising:
providing a first electronic component over the first side of the substrate;
coupling the first electronic component with the floating pad; and
providing an encapsulant over the first side of the substrate, wherein the encapsulant contacts a lateral side of the first electronic component, and wherein the encapsulant is in the second groove and the third groove.

20. The method of claim 19, comprising:
prior to providing the encapsulant:
providing a second electronic component over the first side of the substrate; and
coupling the second electronic component with the first electronic component via the floating pad.

* * * * *